United States Patent
Yamagami et al.

(10) Patent No.: US 12,167,213 B2
(45) Date of Patent: Dec. 10, 2024

(54) AUDIO CIRCUIT, AND REPRODUCTION METHOD OF DSD SIGNAL

(71) Applicant: ROHM CO., LTD., Kyoto (JP)

(72) Inventors: Shinji Yamagami, Kyoto (JP); Moto Yamada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 176 days.

(21) Appl. No.: 17/850,126

(22) Filed: Jun. 27, 2022

(65) Prior Publication Data

US 2022/0329942 A1   Oct. 13, 2022

Related U.S. Application Data

(63) Continuation of application No. PCT/JP2020/046771, filed on Dec. 15, 2020.

(30) Foreign Application Priority Data

Dec. 27, 2019   (JP) ................................ 2019-239618

(51) Int. Cl.
  *H04R 3/04*   (2006.01)
  *G06F 1/08*   (2006.01)
  *H03M 1/68*   (2006.01)

(52) U.S. Cl.
  CPC ............... *H04R 3/04* (2013.01); *G06F 1/08* (2013.01); *H03M 1/687* (2013.01); *H04R 2430/01* (2013.01)

(58) Field of Classification Search
  None
  See application file for complete search history.

(56) References Cited

U.S. PATENT DOCUMENTS

| | | | |
|---|---|---|---|
| 9,875,750 B2 | 1/2018 | Peterson et al. | |
| 2009/0033639 A1* | 2/2009 | Oka | G10H 1/46 345/184 |
| 2017/0372717 A1 | 12/2017 | Peterson et al. | |
| 2018/0218744 A1* | 8/2018 | Kamkar | H03G 3/002 |
| 2020/0304144 A1* | 9/2020 | Milot | G06F 7/49942 |

OTHER PUBLICATIONS

International Search Report for International Application No. PCT/JP2020/046771; Date of Mailing, Mar. 16, 2021.
PCT International Preliminary Report on Patentability with Written Opinion of the International Searching Authority for International Application No. PCT/JP2020/046771; Date of Mailing, Mar. 16, 2021.

* cited by examiner

*Primary Examiner* — Harry S Hong
(74) *Attorney, Agent, or Firm* — CANTOR COLBURN LLP (57) ABSTRACT

The audio circuit has a volume circuit structured to process a DSD signal that contains DSD data and a DSD clock. The volume circuit has a first shift register and a replacement circuit. The first shift register holds N bits of the DSD data. The replacement circuit replaces (N−M) bits (0≤M≤N) corresponding to a gain set value, out of N bits stored in the first shift register, with a mute bit string having a mark rate of substantially 50%.

9 Claims, 8 Drawing Sheets

AUDIO CIRCUIT, AND REPRODUCTION METHOD OF DSD SIGNAL

CROSS REFERENCE TO RELATED APPLICATIONS

This application is a continuation under 35 U.S.C. § 120 of PCT/JP2020/046771, filed Dec. 15, 2020, which is incorporated herein by reference, and which claimed priority to Japanese Application No. 2019-239618, filed Dec. 27, 2019. The present application likewise claims priority under 35 U.S.C. § 119 to Japanese Application No. 2019-239618, filed Dec. 27, 2019, the entire content of which is also incorporated herein by reference.

BACKGROUND

1. Technical Field

The present disclosure relates to audio signal processing, and particularly to a reproduction technology of DSD signal.

2. Description of the Related Art

In the recent audio scene, there has been an accelerating trend of making sound sources compatible with high-resolution format. Under such circumstances, a format called direct stream digital (DSD) has become popular typically in network distribution of sound sources, driving the demand for a reproduction apparatus compatible therewith. The DSD system per se is a known system and has also been adopted typically in Super Audio CD (SACD).

The DSD system is a sort of pulse density modulation (PDM) in which audio waveform is recorded in the form of a stream of single bits as a result of pulse density modulation, wherein the original audio waveform can be reproduced in principle by allowing the bit stream to pass through a low-pass filter.

The reproduction method of audio signal in the DSD format is classified into non-native playback and native playback. The non-native playback once converts a DSD signal into a pulse code modulation (PCM) signal, and then converts the signal through a D/A converter into an analog audio signal.

On the other hand, the native playback directly subjects the DSD signal to D/A conversion to convert the signal into an analog audio signal, without conversion once into the PCM signal.

The non-native playback can subject the PCM signal to various digital signal processing such as volume control and equalizing, with use of a digital signal processor or digital sound processor (DSP). The PCM conversion, however, causes a delay and is susceptible to jitter. Therefore, native playback is more superior in terms of sound quality.

On the other hand, native playback, despite its superiority in terms of sound quality, is limited by incapability of volume control in digital application.

SUMMARY

The present disclosure has been made considering this situation.

One embodiment of the present disclosure relates to an audio circuit. The audio circuit has a volume circuit structured to process a direct stream digital (DSD) signal that contains DSD data and a DSD clock. The volume circuit has an N-bit (N≥2) first shift register structured to hold the DSD data; and a replacement circuit structured to replace (N−M) bits (0≤M≤N) corresponding to a gain set value, out of N bits stored in the first shift register, with a mute bit string having a mark rate of substantially 50%.

It is to be noted that any arbitrary combination or rearrangement of the above-described structural components and so forth is effective as and encompassed by the present embodiments. Moreover, all of the features described in this summary are not necessarily required by embodiments so that the embodiment may also be a sub-combination of these described features. In addition, embodiments may have other features not described above.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

An outline of several example embodiments of the disclosure follows. This outline is provided for the convenience of the reader to provide a basic understanding of such embodiments and does not wholly define the breadth of the disclosure. This outline is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

Outline of Embodiments

One embodiment disclosed herein relates to an audio circuit. The audio circuit has a volume circuit. The volume circuit has an N-bit (N≥2) first shift register structured to hold the direct stream digital (DSD) data of the DSD signal; and a replacement circuit structured to replace (N−M) bits (0≤M≤N) corresponding to a gain set value, out of N bits stored in the first shift register, with a mute bit string having a mark rate of substantially 50%.

The N bits after the replacement by the replacement circuit will have the mark rate that approaches 50% as the gain set value decreases and will become closer to a mute state. This enables volume control in the DSD native format.

Use of a mute bit string having a fixed pattern would deviate the mute bit string from 50%, if the gain set value is fixed to a state where (N−M) has an odd number, thus degrading the sound quality. In one embodiment, the mute bit string may therefore be inverted every DSD clock cycle. This makes the time average of the mark rate of the mute bit string closer to 50%, making it possible to prevent the sound quality from degrading.

In one embodiment, a pseudo-random bit sequence (PRBS) having a mark rate of 50% may be used as the mute bit string. This makes the time average of the mark rate of the mute bit string closer to 50%, making it possible to prevent the sound quality from degrading.

In one embodiment, the replacement circuit may have an N-bit second shift register structured to receive data inverted every cycle of the DSD clock; and a coupler structured to couple M bits from one end of the first shift register, and (N−M) bits from the other end of the second shift register. The second shift register can generate a mute bit string that is inverted every DSD clock cycle.

In one embodiment, the volume circuit may further have a counter structured to change the gain set value from an initial value before volume change toward a target value after volume change, upon change of the volume set value.

In one embodiment, time, or a slope over which the gain set value changes from the initial value to reach the target value is allowed for setting.

In one embodiment, the audio circuit may further have an electric current segment D/A converter structured to receive, as an input, N bits generated by the replacement circuit.

Mode of Embodiments

The present disclosure will be explained below on the basis of preferred embodiments, referring to the attached drawings. All constituents, members and processes illustrated in the individual drawings will be given same reference numerals, so as to properly avoid redundant explanations. The embodiments are merely illustrative and are not restrictive about the disclosure. All features and combinations thereof described in the embodiments are not always essential to the disclosure.

In the present specification, a "state in which member A is connected to member B" includes a case where the member A and the member B are physically and directly connected, and a case where the member A and the member B are indirectly connected via some other member that does not substantially affect the electrical connection state between the members A and B, or does not undermine the function or effect demonstrated by the coupling between the members A and B.

Similarly, a "state in which member C is provided between member A and member B" includes a case where the member A and the member C, or the member B and the member C are directly connected, and a case where they are indirectly connected via some other member that does not substantially affect the electrical connection state among the members or does not undermine the function or effect demonstrated by the members.

Figure 1:
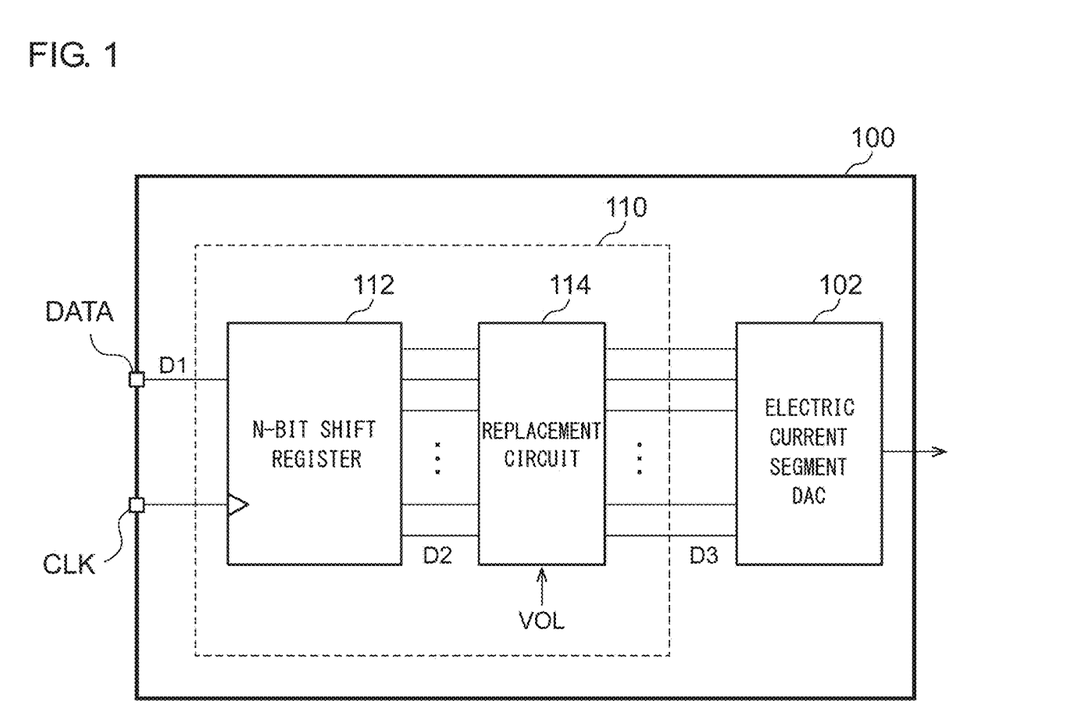
FIG. 1 is a circuit diagram of an audio circuit according to an embodiment.

FIG. 1 is a circuit diagram of an audio circuit 100 according to an embodiment. The audio circuit 100 is an integrated circuit (IC) integrated on one semiconductor substrate. For example, the audio circuit 100 is a DAC chip in which a D/A converter 102 and a volume circuit 110 are integrated.

The audio circuit 100 has a data pin DATA and a clock pin CLK, and receives a DSD signal that includes DSD data D1 and a DSD clock CLK. The volume circuit 110 receives the DSD signal that includes the DSD data D1 and the DSD clock CLK, and subjects the signal to volume control corresponding to a volume set value VOL. The DSD data D1 in the mute state has 0 and 1 both following a probability of appearance of 50%, and any deviation from 50% represents an audio signal component.

The volume circuit 110 has a first shift register 112 and a replacement circuit 114. The first shift register 112 holds N bits (N≥2) of the DSD data. N typically represents 128 but is not limited thereto.

The replacement circuit 114 replaces (N−M) bits (0≤M≤N) corresponding to a gain set value, out of N-bit string D2 stored in the first shift register 112, with a mute bit string MB having a mark rate of substantially 50%, and outputs a bit string D3 after the replacement. Bit number M will be N for the maximum gain and will be 0 for the minimum gain.

Figure 2:
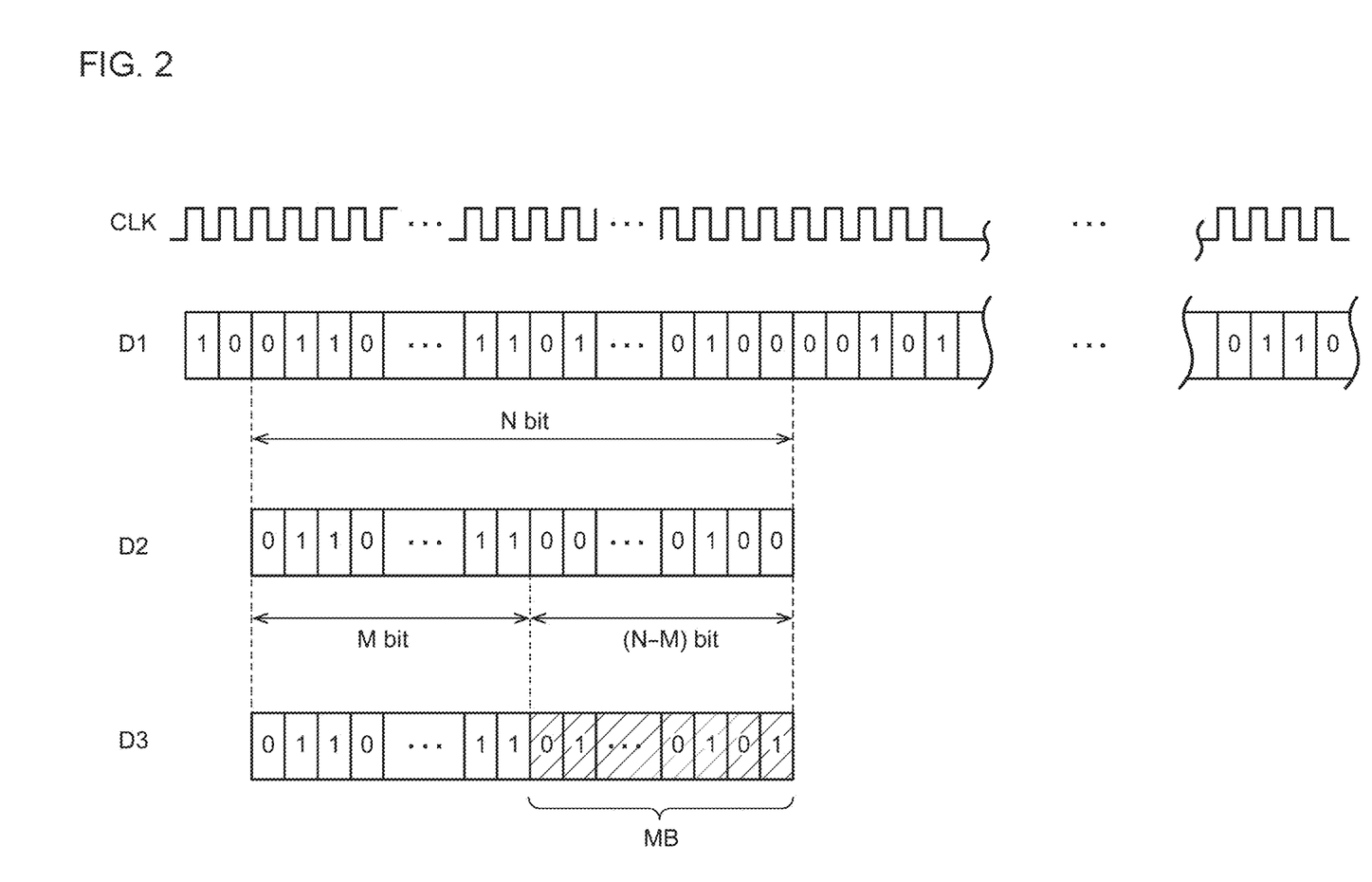
FIG. 2 is an operation waveform diagram of the audio circuit illustrated in FIG. 1.

The audio circuit 100 is thus configured. Next, operation of the audio circuit 100 will be explained. FIG. 2 is an operation waveform diagram of the audio circuit 100 illustrated in FIG. 1.

D1 represents DSD data. The DSD data is a pulse-density modulated bit stream of 1 and 0. In a certain clock cycle, N-bit data D2 out of the DSD data D1 is stored in the first shift register 112.

The replacement circuit 114 replaces the (N−M) bits out of the N-bit data D2 with the mute bit string MB having a mark rate of 50%. M bits out of the N-bit data D2 remain original. In this example, the mute bit string MB is a bit string in which 1 and 0 are alternately arranged. The data D3 after the replacement is input to an A/D converter in the subsequent stage and is converted into an analog signal.

The audio circuit 100 repeats the same processing, while shifting the bit string D2, to be stored in the first shift register 112 out of the DSD data D1, in the right direction every clock cycle.

Figure 3:
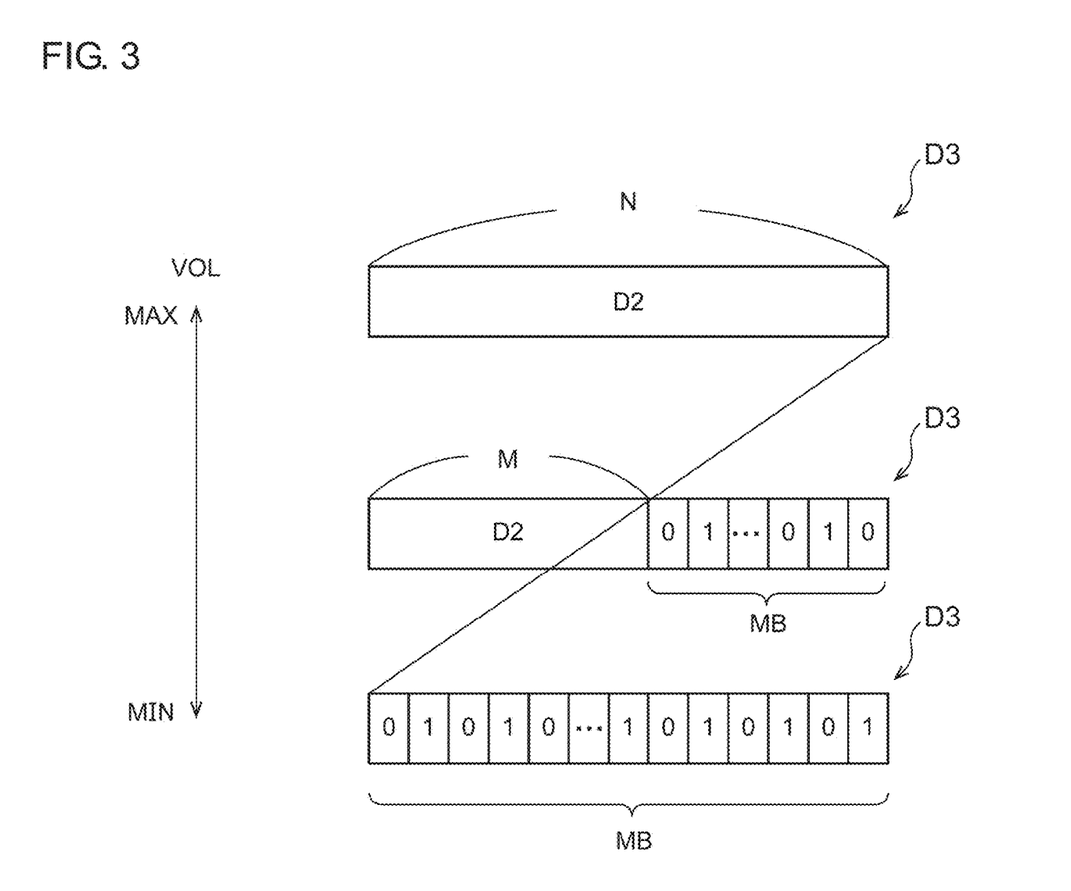
FIG. 3 is a diagram for explaining volume control in the audio circuit illustrated in FIG. 1.

FIG. 3 is a diagram for explaining volume control in the audio circuit 100 illustrated in FIG. 1. M=N holds for the maximum value MAX of the volume set value VOL, causing output of the DSD data D2 (equal to D1) directly as the DSD data D3.

M=0 holds for the minimum value MIN of the volume set value VOL, causing replacement of all bits of the input DSD data D2 with the mute bit string MB. The reproduced DSD data in this state causes a mute state since the mark rate thereof is 50%.

0<M<N holds for an intermediate value of the volume set value VOL that falls between the minimum value MIN and the maximum value MAX, causing replacement of a part of the input DSD data D2 with the mute bit string MB. An effective sound volume of the reproduced DSD data amounts to M/N times the sound volume that corresponds to the maximum volume set value.

The audio circuit 100 thus operates. The audio circuit 100 enables volume control according to the DSD native format. The volume control according to the DSD native format, needing no PCM conversion, can reduce delay time during audio reproduction, and can reduce power consumption of the circuit. The volume circuit 110 is also simple and needs only a small circuit area, since it can be built up with a shift register combined with a bit replacement circuit.

The present disclosure encompasses various apparatuses and methods that are understood from the block diagram in FIG. 1 or a circuit diagram, or derived from the description above, and is not limited to a specific structure. Hereinafter, more specific exemplary structures and examples will be described to help understanding or to clarify the spirit of the disclosure or the operations, without narrowing the scope of the present disclosure.

Figure 4:
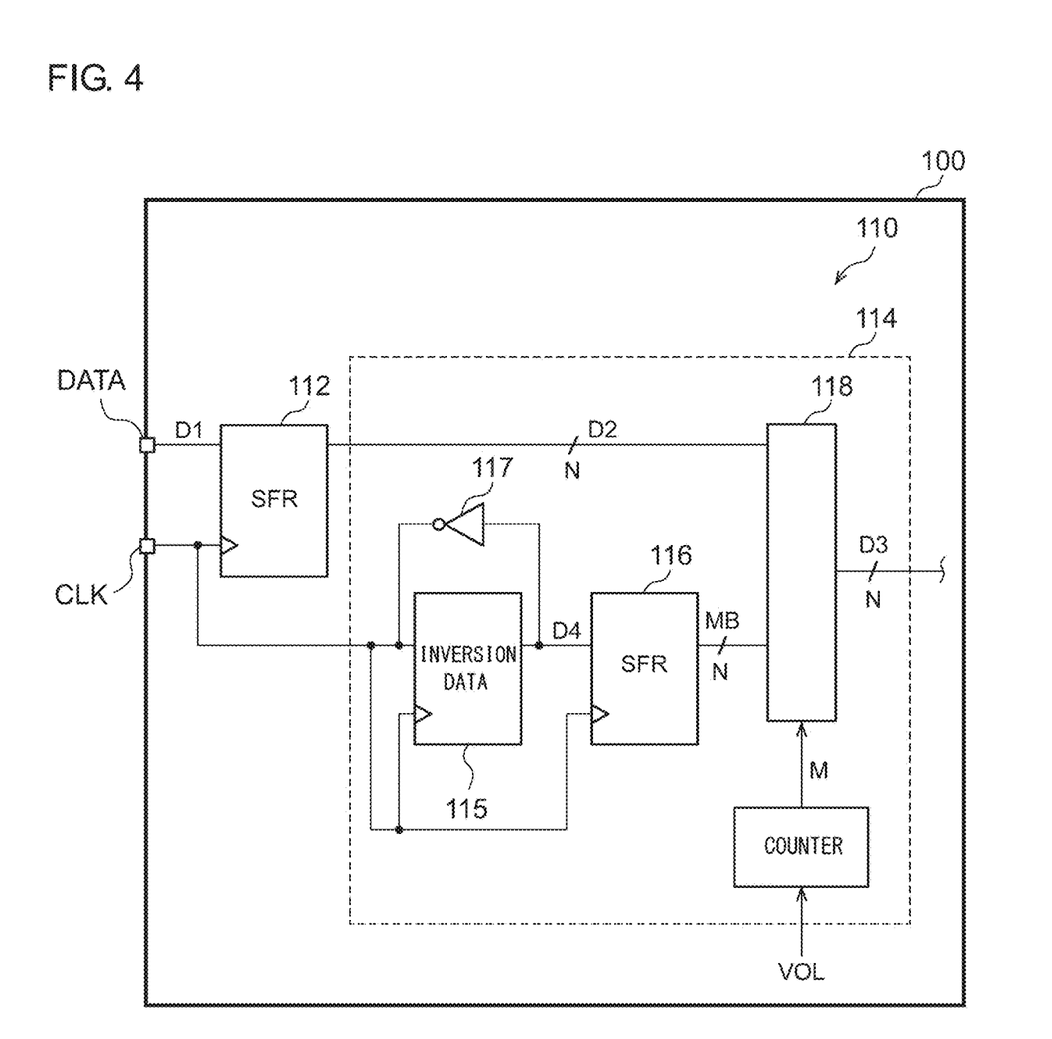
FIG. 4 is a circuit diagram of a volume circuit according to an embodiment.

FIG. 4 is a circuit diagram of the volume circuit 110 according to an embodiment. The mute bit string MB in this example is inverted every cycle of the DSD clock CLK. The replacement circuit 114 has a second shift register 116 and a coupler 118. Similarly, to the first shift register 112, the second shift register 116 has a size of N bits, and receives at the input thereof data (referred to as clock inversion data) D4 inverted every cycle of the DSD clock CLK. The bit string stored in the second shift register 116 is inverted every cycle of the DSD clock CLK. The clock inversion data D4 may be generated by a flip-flop 115 and an inverter 117.

The coupler 118 couples M bits from one end of the first shift register 112 and (N−M) bits from the other end of the second shift register 116, and outputs the N-bit DSD data D3.

The replacement circuit 114 further has a counter 120. The counter 120 changes the gain set value, that is M, from an initial value before volume change toward a target value after volume change, upon change of the volume set value VOL.

A time or a slope over which the gain set value M changes from the initial value to reach the target value is preferably allowed for setting with use of the register.

Figure 5:
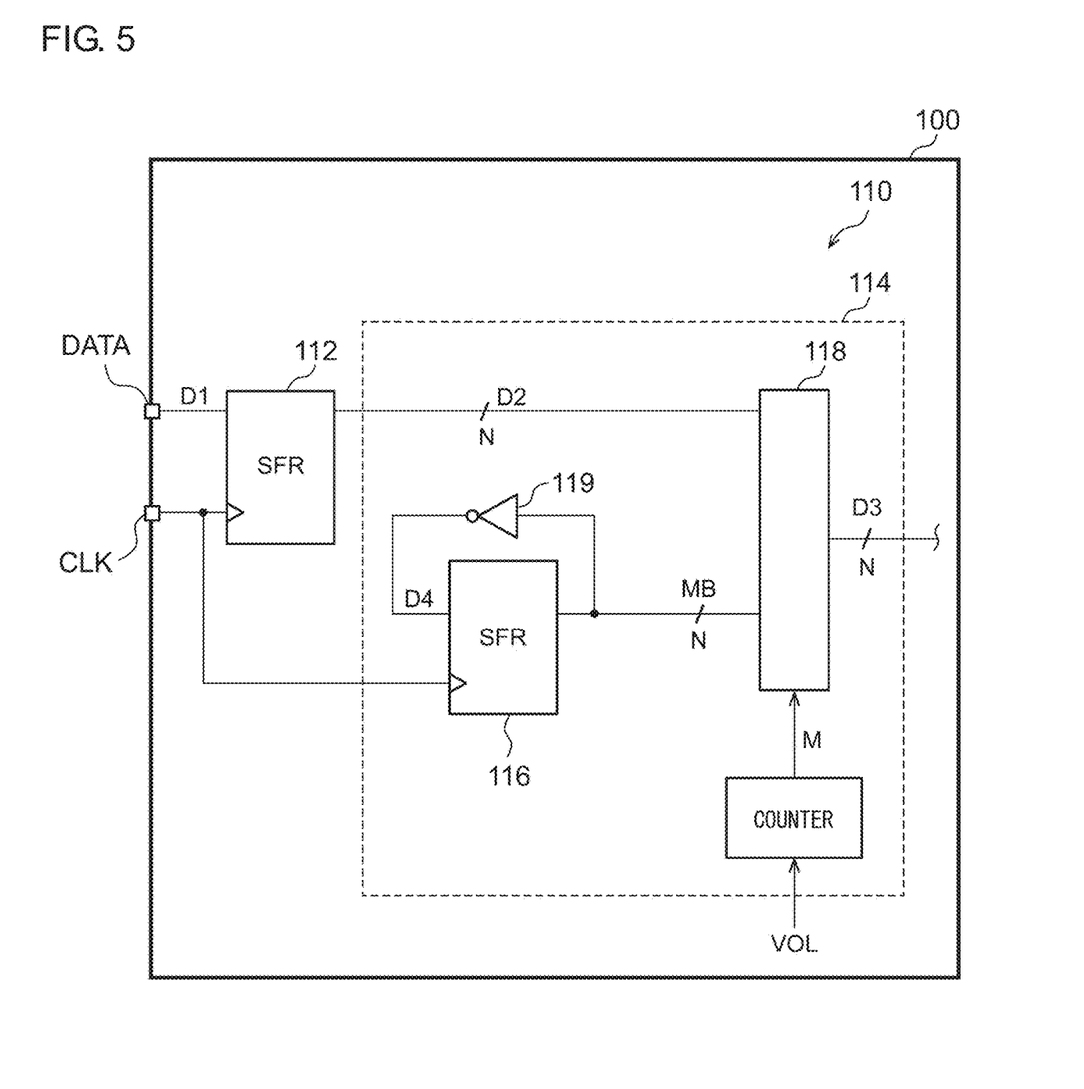
FIG. 5 is a circuit diagram of a volume circuit according to an embodiment.

FIG. 5 is a circuit diagram of the volume circuit 110 according to a modified example. The clock inversion data D4 is generated by inverting the output of the second shift register 117 with use of the inverter 116. Alternatively, a signal obtained by delaying the DSD clock by approximately ¼ cycle may be used as the clock inversion data D4.

Figure 6:
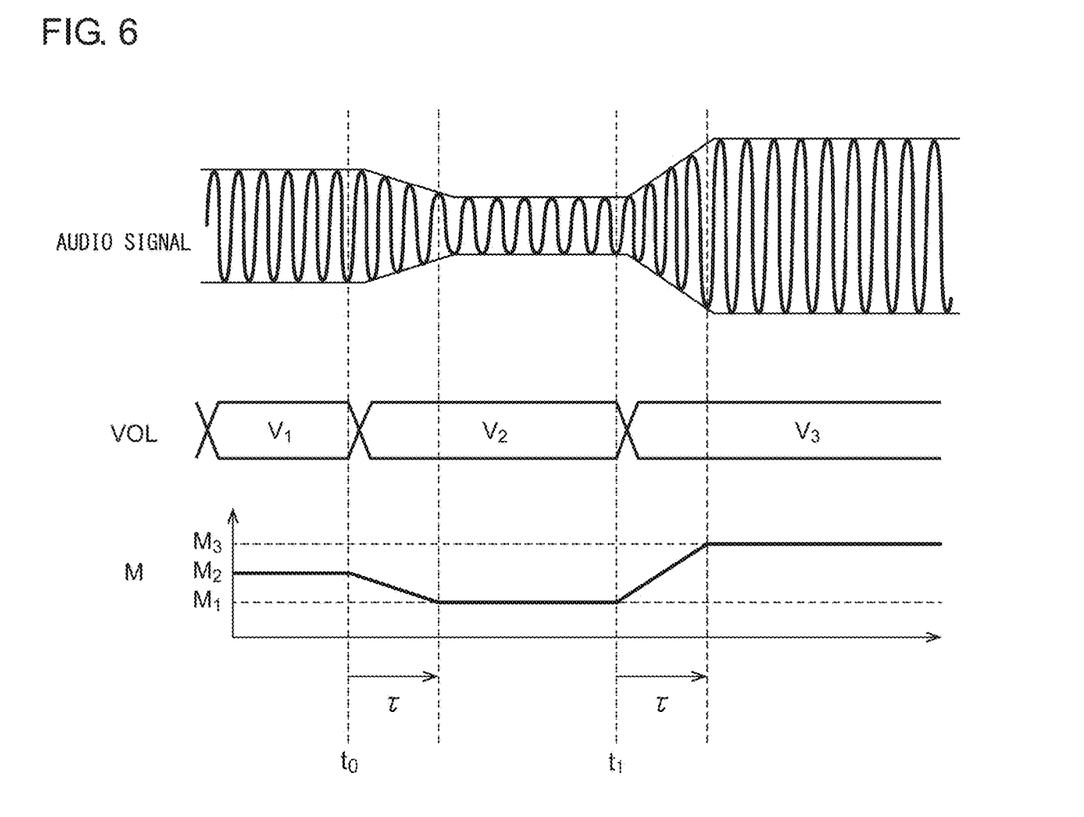
FIG. 6 is an operation waveform diagram of the volume circuit illustrated in FIG. 4.

The volume circuit 110 is thus configured. Next, the operations will be explained. FIG. 6 is an operation waveform diagram of the volume circuit 110 illustrated in FIG. 4 or FIG. 5. Before the time to, the volume set value VOL has a certain value $V_1$, and the gain set value M has value $M_2$ corresponding to the volume set value $V_1$.

At time to, the user changes the volume set value VOL to value $V_2$. In response, the counter 120 decreases the gain set value M from the initial value $M_2$ corresponding to the volume set value $V_1$ before changed to the target value $M_1$ corresponding to the volume set value $V_2$ after changed over the transition time τ. As a result, the amplitude, or the sound volume of the audio signal, which is the output of the D/A converter, gradually decreases.

At time $t_1$, the user changes the volume set value VOL to value $V_3$. In response, the counter 120 decreases the gain set value M from the initial value $M_1$ corresponding to the volume set value $V_2$ before changed to the target value $M_3$ corresponding to the volume set value $V_3$ after changed over the transition time τ. As a result, the amplitude, or the sound volume of the audio signal, which is the output of the D/A converter, gradually increases.

Although the counter 120 operates in FIG. 6 while keeping the transition time τ of the gain set value M constant, it does not necessarily operate in this way, and may alternatively operate while keeping the slope of the gain set value M constant. The transition time τ ranges from the order of several tens to several hundreds of milliseconds.

Figure 7:
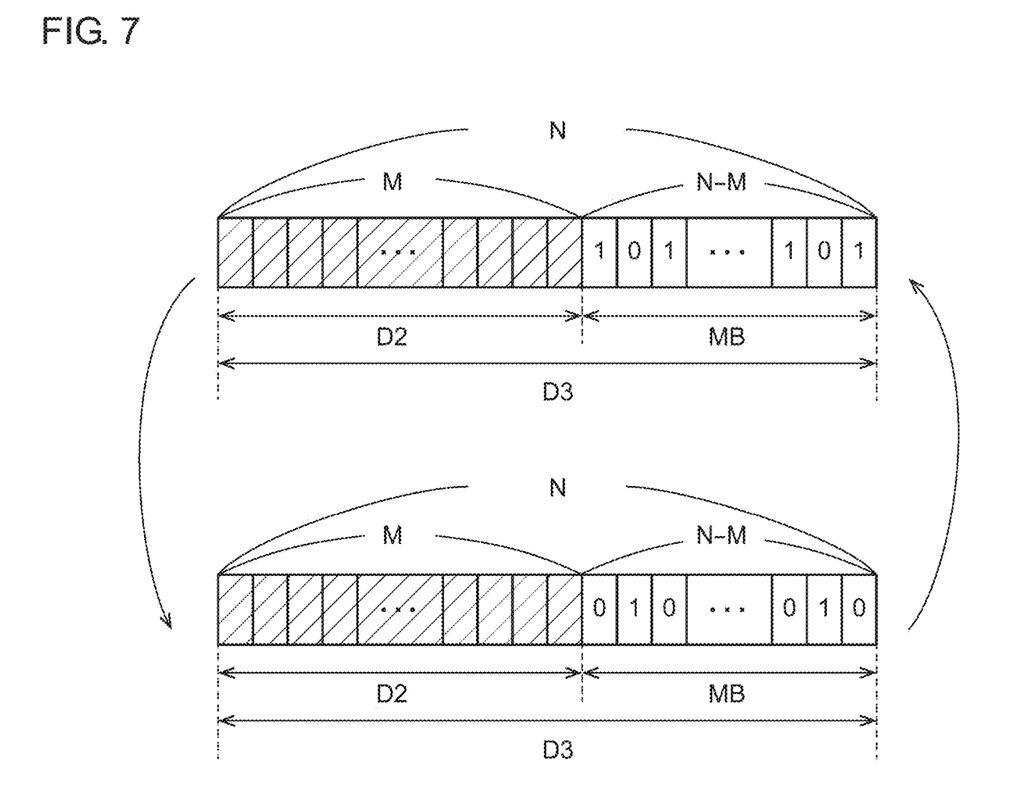
FIG. 7 is a diagram for explaining an internal operation of the volume circuit illustrated in FIG. 4.

FIG. 7 is a diagram for explaining an internal operation of the volume circuit 110 illustrated in FIG. 4. Consider a situation where the gain set value M is fixed to a certain value that satisfies 0<M<N. In this case, the mute bit string MB, contained in the DSD data D3 after volume control, will have therein 1 and 0 inverted in the cycle of the DSD clock CLK. Note that the audio component D2 contained in the DSD data D3 is shifted by one bit every cycle of the DSD clock CLK.

The volume circuit 110 thus operates internally. Use of a mute bit string MB having a fixed pattern would deviate the mark rate of the mute bit string MB from 50%, if (N−M) represents an odd number, causing DC offset, and thus degrading the sound quality. Meanwhile according to the volume circuit 110 illustrated in FIG. 6, the mute bit string MB will have a time average value of the mark rate of 50%, even if (N−M) represents an odd number, thus suppressing an influence of the DC offset.

In an alternative case where a current segment type D/A converter is arranged in the subsequent stage of the volume circuit 110, the fixed mute bit string MB consequently fixes the state of a segment that corresponds to the mute bit string MB. In contrast, the mute bit string MB that is inverted every clock cycle switches the current segment DAC to be turned on, thus obtaining an effect of so-called direct element matching.

The present disclosure has been explained referring to the embodiments. It is to be understood by those skilled in the art that these embodiments are merely illustrative, that the individual constituents or combinations of various processes may be modified in various ways, and that also such modifications fall within the scope of the present disclosure. The modified examples will be explained below.

Modified Example 1

A pseudo random signal PRBS having a mark rate of 50% may also be used as the mute bit string. In this case, the second shift register 116 in FIG. 4 may simply be replaced with an N-bit PRBS generator. Also, with use of the PRBS, the time average value of the mark rate of the mute bit string MB can be brought closer to 50%.

Modified Example 2

A fixed pattern may also be used as the mute bit string. In this case, the circuit configuration may further be simplified, while the DC offset would occur. When using the fixed pattern, the gain set value M may be changed so that (M−N) will represent an even number, thus avoiding the DC offset.

Figure 8:
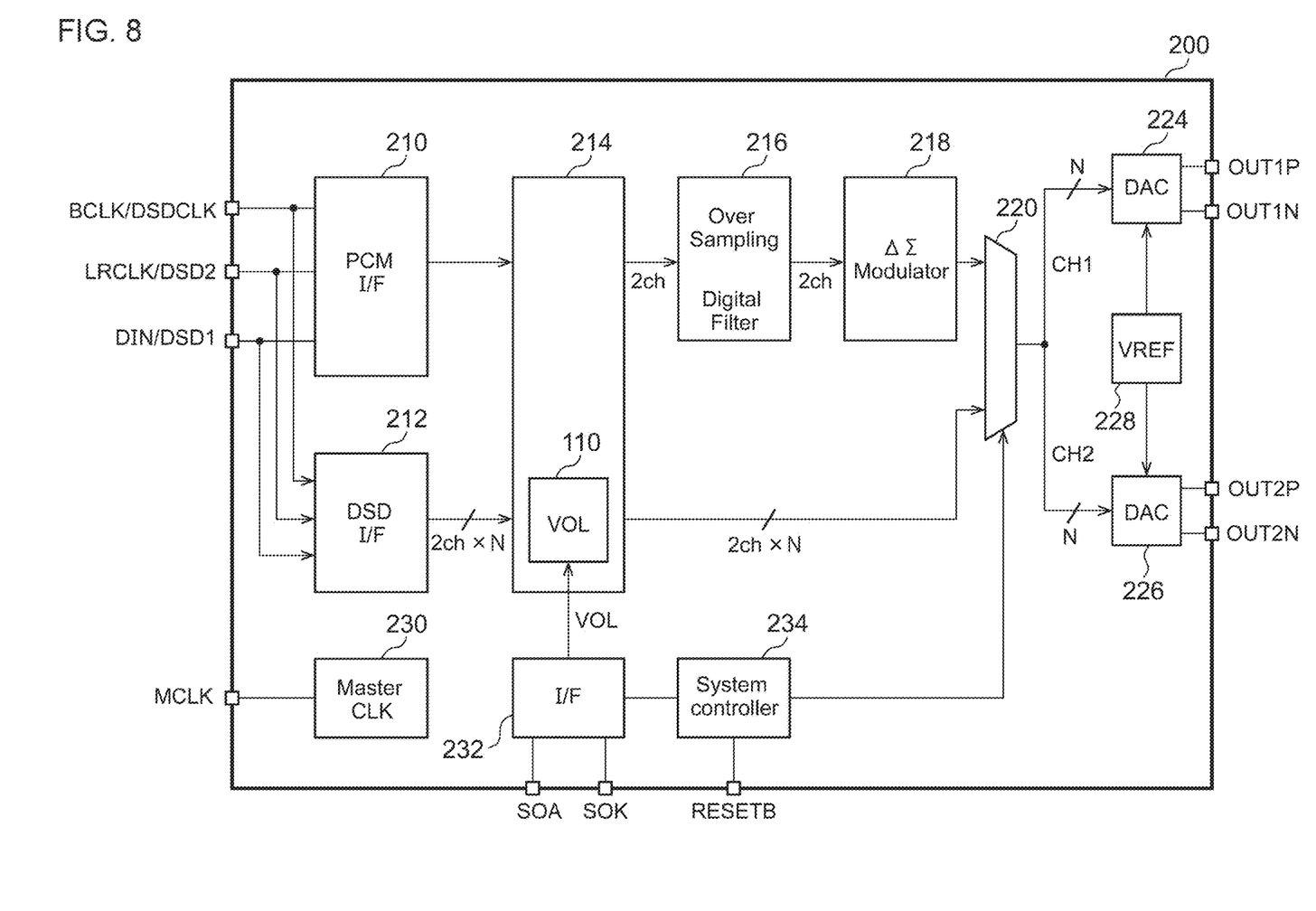
FIG. 8 is a block diagram of a D/A converter IC.

Finally, a specific example of the audio circuit 100 will be explained. FIG. 8 is a block diagram of a D/A converter IC 200. The D/A converter IC 200 is configured with use of an architecture of the aforementioned audio circuit 100.

The D/A converter IC 200 receives an audio signal in the PCM format or the DSD format, converts the audio signal into an analog audio signal, and outputs the signal.

On a certain platform (referred to as a PCM platform), a PCM sound source is connected to a BCLK pin, an LRCLK pin, and a DIN pin of the D/A converter IC 200, through which 2-channel audio signal (L channel and R channel, for example) is input in an I²S (Inter-IC Sound) format. On another platform (DSD platform), a DSD sound source is connected to a DSDCLK pin, a DSD1 pin, and a DSD2 pin of the D/A converter IC 200, through which 2-channel audio signal is input in a DSD format.

In the present embodiment, the BCLK pin and the DSD-CLK pin, the LRCLK pin and the DSD2 pin, and the DIN pin and the DSD1 pin are respectively commonalized.

A PCM interface 210, an audio function controller 214, an oversampling digital filter 216, and a ΔΣ modulator 218 become active on the PCM platform. The audio function controller 214 subjects the PCM signal, received by the PCM interface 210, to signal processing such as volume control. The oversampling digital filter 216 oversamples the output of the audio function controller 214 and controls the frequency characteristics through a digital filter. The ΔΣ modulator 218 subjects the output of the oversampling digital filter 216 to ΔΣ modulation. The output of the ΔΣ modulator 218 is a 2-channel signal, wherein each channel is an N-bit PDM signal. The PDM signal having a size of N bits×2 channels is input to the current segment DACs 224 and 226 by channel via the selector 220. The current segment DACs 224 and 226 correspond to the D/A converter 102 in FIG. 1. A reference voltage source 228 supplies a reference voltage to the current segment DACs 224 and 226. The current segment DACs 224 and 226, although illustrated in FIG. 8 to cause differential current outputs, are not limited thereto, and may instead allow single-ended output or voltage output.

The DSD interface 212 becomes active on the DSD platform and receives from an external DSD source the DSD signal, which is more specifically the DSD clock, and DSD data for two channels. The first shift register 112 of the volume circuit 110 may be structured as a part of the DSD interface 212.

The audio function controller 214 has the aforementioned volume circuit 110. The volume circuit 110 subjects the two-channel DSD signals, received by the DSD interface 212, to volume control.

The DSD signal after the volume control (the aforementioned DSD data D3) output from the volume circuit 110 is input, through the selector 220, to the current segment DACs 224 and 226 respectively for the channels.

A clock generator 230 multiplies the reference clock to generate a master clock.

A serial interface 232 is an I²C or SPI interface, having a data pin SDA and a clock pin SCL to which an external host processor is connected. The serial interface 232 receives a volume set value and various parameters from the host processor. The parameters typically include a time constant, and slope used for soft transition of the volume. The volume set value received by the serial interface 232 is supplied to the audio function controller 214.

The system controller 234 controls the entire D/A converter IC 200 in an integrated manner. A reset signal is input to the system controller 234.

Having described the present disclosure with use of specific terms referring to the embodiments, the embodiments merely illustrate the principle and applications of the present disclosure, allowing a variety of modifications and layout change without departing from the spirit of the present disclosure specified by the claims.

What is claimed is:

1. An audio circuit comprising
a volume circuit structured to process a direct stream digital (DSD) signal that contains DSD data and a DSD clock, and
the volume circuit comprising:
an N-bit (N≥2) first shift register structured to hold the DSD data; and
a replacement circuit structured to replace (N−M) bits (0≤M≤N) corresponding to a gain set value, out of N bits stored in the first shift register, with a mute bit string having a mark rate of substantially 50%,
wherein the volume circuit further comprises a counter structured to change the gain set value from an initial value before changed toward a target value after changed over a time greater than zero or a slope having an inclination angle greater than 90 degrees and less than 180 degrees, upon change of a volume set value, and
the time or the slope is settable.

2. The audio circuit according to claim 1, wherein the mute bit string is inverted every DSD clock cycle.

3. The audio circuit according to claim 2, wherein the replacement circuit comprises:
an N-bit second shift register structured to receive data inverted every cycle of the DSD clock; and
a coupler structured to couple M bits from one end of the first shift register, and (N−M) bits from the other end of the second shift register.

4. An audio circuit comprising
a volume circuit structured to process a direct stream digital (DSD) signal that contains DSD data and a DSD clock, and
the volume circuit comprising:
an N-bit (N≥2) first shift register structured to hold the DSD data; and
a replacement circuit structured to replace (N−M) bits (0≤M≤N) corresponding to a gain set value, out of N bits stored in the first shift register, with a mute bit string having a mark rate of substantially 50%, wherein a time or a slope over which the gain set value changes from the initial value to reach the target value is settable, and
the time is greater than zero or an inclination angle of the slope is greater than 90 degrees and less than 180 degrees.

5. The audio circuit according to claim 1, further comprising a current segment D/A converter structured to receive, as an input, N bits generated by the replacement circuit.

6. A reproduction method for a direct stream digital (DSD) signal that contains DSD data and a DSD clock, the method comprising:
holding the DSD data in an N-bit (N≥2) first shift register; and
replacing (N−M) bits (0≤M≤N) corresponding to a gain set value, out of N bits stored in the first shift register, with a mute bit string having a mark rate of substantially 50%,
changing the gain set value from an initial value before changed toward a target value after changed over a time greater than zero or a slope having an inclination angle greater than 90 degrees and less than 180 degrees, upon change of a volume set value,
wherein the time or the slope is settable.

7. The reproduction method according to claim 6, wherein the mute bit string is inverted every DSD clock cycle.

8. The reproduction method according to claim 6, wherein the replacing comprises:
inputting data inverted every cycle of the DSD clock, to an N-bit second shift register; and
coupling M bits from one end of the first shift register, and (N−M) bits from the other end of the second shift register.

9. The reproduction method according to claim 6, further comprising converting N bits, generated in the replacing, into an analog signal with use of a current segment D/A converter.

* * * * *